US012796252B2

(12) United States Patent
Hu et al.

(10) Patent No.: US 12,796,252 B2
(45) Date of Patent: Nov. 10, 2026

(54) DISPLAY MODULE COMPRISING LAND GRID ARRAY PACKAGE STRUCTURE INTEGRATED ONTO DISPLAY PANEL

(71) Applicants: Chengdu BOE Optoelectronics Technology Co., Ltd., Chengdu (CN); BOE Technology Group Co., Ltd., Beijing (CN)

(72) Inventors: Yao Hu, Beijing (CN); Yipeng Chen, Beijing (CN); Ling Shi, Beijing (CN)

(73) Assignees: Chengdu BOE Optoelectronics Technology Co., Ltd., Chengdu (CN); Beijing BOE Technology Development Co., Ltd., Beijing (CN)

( * ) Notice: Subject to any disclaimer, the term of this patent is extended or adjusted under 35 U.S.C. 154(b) by 366 days.

(21) Appl. No.: 18/577,990

(22) PCT Filed: Aug. 3, 2022

(86) PCT No.: PCT/CN2022/109977
§ 371 (c)(1),
(2) Date: Jan. 9, 2024

(87) PCT Pub. No.: WO2024/026732
PCT Pub. Date: Feb. 8, 2024

(65) Prior Publication Data
US 2025/0098454 A1 Mar. 20, 2025

(51) Int. Cl.
*H10K 59/131* (2023.01)
*H10K 59/40* (2023.01)
*H10K 77/10* (2023.01)
*H10K 102/00* (2023.01)

(52) U.S. Cl.
CPC .......... *H10K 59/131* (2023.02); *H10K 59/40* (2023.02); *H10K 77/111* (2023.02); *H10K 2102/311* (2023.02)

(58) Field of Classification Search
None
See application file for complete search history.

(56) References Cited

U.S. PATENT DOCUMENTS

2017/0061193 A1* 3/2017 Young ................ G06V 40/1306
2017/0215288 A1* 7/2017 Shi ......................... H05K 3/007
2018/0049324 A1 2/2018 Koo et al.
2023/0209754 A1* 6/2023 Lee .......................... H05K 5/03
361/714

FOREIGN PATENT DOCUMENTS

CN 216250726 U 4/2022
CN 114823796 A 7/2022

* cited by examiner

*Primary Examiner* — Daniel Whalen
(74) *Attorney, Agent, or Firm* — HOUTTEMAN LAW LLC

(57) ABSTRACT

The present disclosure provides a display module and a display apparatus, which belong to the field of display technology and can solve the technical problem of notably insufficient space reserved for batteries in the display module that causes a notably reduced battery capacity and influences standby time of the display apparatus in the existing art. The display module of the present disclosure includes a display panel, and a driver integrated circuit and a passive device each electrically connected to the display panel. The driver integrated circuit and the passive device are packaged in a land grid array package structure. The land grid array package structure is integrated onto the display panel.

7 Claims, 3 Drawing Sheets

DISPLAY MODULE COMPRISING LAND GRID ARRAY PACKAGE STRUCTURE INTEGRATED ONTO DISPLAY PANEL

TECHNICAL FIELD

The present disclosure relates to the field of display technology, and specifically relates to a display module and a display apparatus.

BACKGROUND

With the development of the display technology, narrow-bezel or bezel-less display screens have gradually become mainstream products in the market in order for larger display and touch areas. Currently, the narrow-bezel or bezel-less property is mainly realized by reducing a bottom bezel of the display screen, where a display driver integrated circuit, a touch integrated circuit, and other components may be folded onto a back side of a display panel through a chip on film (COF) process to achieve the purpose of reducing the bezel.

The chip on film process generally includes fixing a touch integrated circuit and other devices into a flexible printed circuit, and then folding the touch integrated circuit and these other devices through the flexible printed circuit. However, the flexible printed circuit occupies a large amount of space on the back side of the display screen, and thus leaves notably insufficient space reserved for batteries, causing a notably reduced battery capacity and influencing standby time of the display apparatus. Although the flexible printed circuit can be bent for a second time to reduce the occupied space, the saved space is still limited due to the presence of the touch integrated circuit and other devices, and the standby time of the display apparatus cannot be effectively prolonged.

SUMMARY

To solve at least one of the technical problems in the existing art, the present disclosure provides a display module and a display apparatus.

In a first aspect, an embodiment of the present disclosure provides a display module, wherein the display module includes a display panel, and a driver integrated circuit and a passive device each electrically connected to the display panel; the driver integrated circuit and the passive device are packaged in a land grid array package structure; and the land grid array package structure is integrated onto the display panel.

Optionally, the display panel includes: a body part and a bent part connected to a side of the body part; and the bent part is bent in a direction away from a display surface of the body part, and extends in a direction parallel to the body part.

Optionally, the land grid array package structure is located on a side of the bent part away from the body part.

Optionally, the display module further includes a flexible printed circuit bonded and connected to the side of the bent part away from the body part; and the flexible printed circuit is bent toward a side of the flexible printed circuit close to the body part to a side of the bent part close to the body part.

Optionally, the display module further includes a flexible printed circuit bonded and connected to the side of the bent part away from the body part; and the flexible printed circuit extends in an extending direction of the bent part and covers the bent part.

Optionally, the land grid array package structure is located on a side of the bent part close to the body part.

Optionally, the display module further includes a flexible printed circuit bonded and connected to the side of the bent part close to the body part; and the flexible printed circuit is bent toward a side of the flexible printed circuit away from the body part to a side of the bent part away from the body part.

Optionally, the display module further includes a flexible printed circuit bonded and connected to the side of the bent part close to the body part; and the flexible printed circuit extends along the bent part and covers the bent part.

Optionally, the land grid array package structure is located in a region other than a bonding region of the flexible printed circuit and the bent part.

Optionally, the flexible printed circuit has a hollowed-out portion into which the land grid array package structure is embedded.

Optionally, the display module further includes a connector; and the connector is electrically connected to the flexible printed circuit.

Optionally, the driver integrated circuit includes a touch integrated circuit and a display driver integrated circuit; and the passive device includes a capacitor, a resistor, an oscillator, and a memory.

Optionally, the display panel is connected to the flexible printed circuit through a first metal wire, and the driver integrated circuit is connected to the flexible printed circuit through a second metal wire; and extending directions of the first metal wire and the second metal wire are intersected, and an anti-interference layer is disposed between the first metal wire and the second metal wire.

Optionally, the display module further includes a polarization layer, a touch panel and a cover plate;

the polarization layer is located on a display surface side of the body part;

the touch panel is located on a side of the polarization layer away from the body part; and the cover plate is located on a side of the touch panel away from the body part.

In a second aspect, an embodiment of the present disclosure further provides a display apparatus, wherein the display apparatus includes the display module as described above, and a power supply source on a side of the body part away from a display surface of the body part.

DETAIL DESCRIPTION OF EMBODIMENTS

To improve understanding of the technical solution of the present disclosure for those skilled in the art, the present disclosure will be described in detail below with reference to accompanying drawings and specific implementations.

Unless otherwise defined, technical or scientific terms used in the present disclosure are intended to have general meanings as understood by those of ordinary skill in the art. The words "first", "second" and similar terms used in the present disclosure do not denote any order, quantity, or importance, but are used merely for distinguishing different components from each other. Also, the use of the terms "a", "an", or "the" and similar referents do not denote a limitation of quantity, but rather denote the presence of at least one. The word "comprising" or "including" or the like means that the element or item preceding the word contains elements or items that appear after the word or equivalents thereof, but does not exclude other elements or items. The terms "connected" or "coupled" and the like are not restricted to physical or mechanical connections, but may include electrical connections, whether direct or indirect. The words "upper", "lower", "left", "right", or the like are merely used to indicate a relative positional relationship, and when an absolute position of the described object is changed, the relative positional relationship may be changed accordingly.

Figure 1:
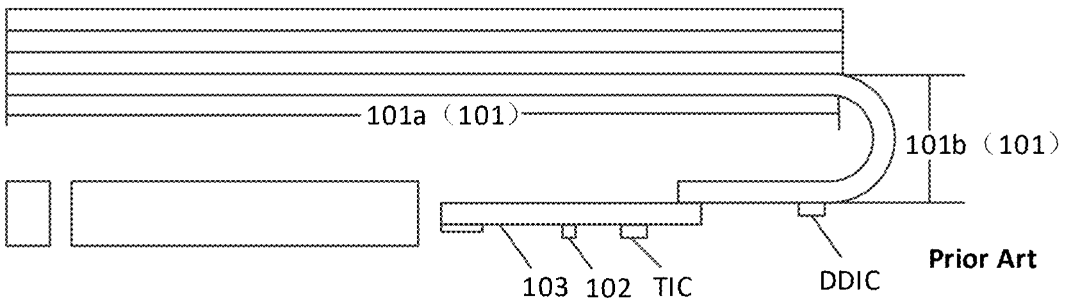
FIG. 1 is a schematic structural diagram of an exemplary display module.

FIG. 1 is a schematic structural diagram of an exemplary display module. As shown in FIG. 1, the display module includes a display panel 101. The display panel 101 includes a body part 101*a* and a bent part 101*b* connected to a side of the body part 101*a*. The bent part 101*b* is bent in a direction away from a display surface of the body part 101*a*, and has a portion parallel to the body part 101*a*. The display module further includes a display driver integrated circuit (DDIC), a touch integrated circuit (TIC), and a passive device 102 electrically connected to the display panel 101. The DDIC is located on a side of the bent part 101*b* away from the body part 101*a*. The TIC and the passive device 102 are fixed onto a flexible printed circuit 103, and bonded and connected to the display panel 101 through the flexible printed circuit 103.

As shown in FIG. 1, the flexible printed circuit 103 in the display module directly extends in a direction away from the bent part 101*b* to be electrically connected to other structures in the display module, and the flexible printed circuit 103 occupies a large amount of space on a back side of the body part 101*a* and thus leaves notably insufficient space reserved for batteries, causing a notably reduced battery capacity and influencing standby time of the display apparatus.

Figure 2:
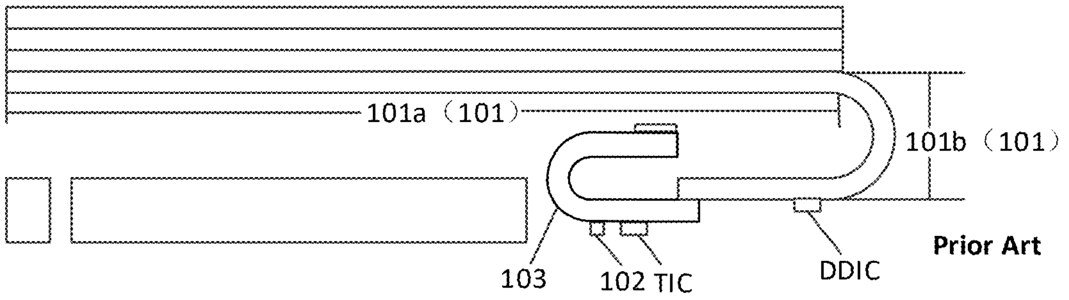
FIG. 2 is a schematic structural diagram of another exemplary display module.

FIG. 2 is a schematic structural diagram of another exemplary display module. The display module shown in FIG. 2 differs from that of FIG. 1 in that: in the display module of FIG. 2, the flexible printed circuit 103 is bent for a second time. Although the flexible printed circuit 103 is bent for a second time to reduce the occupied space, the saved space is still limited due to the presence of the TIC and the passive device 102, and the standby time of the display apparatus cannot be effectively prolonged.

To solve at least one of the above technical problems, embodiments of the present disclosure provide a display module and a display apparatus, which will be described in further detail below with reference to the accompanying drawings and specific implementations.

Figure 3:
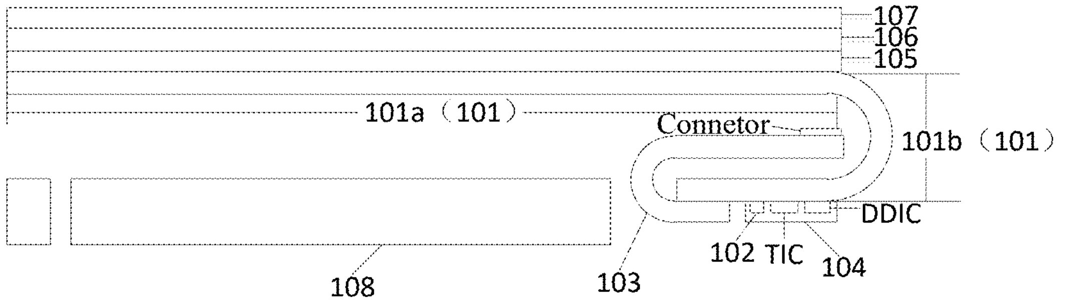
FIG. 3 is a schematic structural diagram of a display module according to an embodiment of the present disclosure.

FIG. 3 is a schematic structural diagram of a display module according to an embodiment of the present disclosure. As shown in FIG. 3, the display module includes a display panel 101, and a driver integrated circuit and a passive device 102 each electrically connected to the display panel 101. The driver integrated circuit and the passive device 102 are packaged in a land grid array package structure 104. The land grid array package structure 104 is integrated onto the display panel 101.

The driver integrated circuit and the passive device 102 in the display module may provide drive signals for the display panel 101 to control the display panel 101 to display a preset display image, thereby implementing a display function. The driver integrated circuit, the passive device 102 and other structures are all packaged in the land grid array package structure 104, and the land grid array package structure 104 may be directly electrically connected to the display panel 101 through metal bumps thereon, so that the land grid array package structure 104 is integrated onto the display panel 101.

In the display module provided in the embodiments of the present disclosure, the driver integrated circuit, the passive device 102 and other structures are all packaged in the land grid array package structure 104, and the land grid array package structure 104 is directly integrated onto the display panel 101, so that the driver integrated circuit, the passive device 102 and other structures are not necessarily fixed onto the flexible printed circuit. In this manner, the space occupied by the flexible printed circuit can be saved, and more space can be reserved for batteries, so that the battery capacity can be increased, and the standby time of the display apparatus can be further prolonged.

In some embodiments, as shown in FIG. 3, the display panel 101 further includes a body part 101*a* and a bent part 101*b* connected to a side of the body part 101*a*. The bent part 101*b* is bent in a direction away from a display surface of the body part 101*a*, and extends in a direction parallel to the body part 101*a*.

Since the body part 101*a* has a display function and can display a preset display image, and the bent part 101*b* can be bent in a direction away from a display surface of the body part 101*a*, a large amount of metal wires on a side of the display surface of the body part 101*a* used for electrical connection with a circuit structure such as the driver circuit are omitted, so that the large amount of metal wires are prevented from affecting the display effect of the body part 101*a*, thereby reducing the bezel of the overall display panel 101, achieving a narrow-bezel or bezel-less display effect, and further improving the user experience. Meanwhile, the bent part 101*b* extends in a direction parallel to the body part 101*a*. The bent part 101*b* may provide a relatively flat bearing plane for the land grid array package structure 104, thereby preventing poor connection between the land grid array package structure 104 and the bent part 101 from affecting the display effect.

It should be noted here that the display module has a display region and a peripheral region surrounding the display region. The body part 101*a* of the display panel 101 is disposed in the display region, and a plurality of gate lines extending in a first direction and a plurality of data lines extending in a second direction are provided in the body part 101*a* of the display panel, where the first direction is intersected with the second direction. The intersected plurality of gate lines and plurality of data lines define a plurality of pixel regions each provided with a pixel, and each pixel includes a pixel driver circuit and a light-emitting device connected to the pixel driver circuit. The pixel driver circuit may specifically have a 7T1C structure, that is, the pixel driver circuit has seven transistors and one storage capacitor, the circuit structure of which may refer to the 7T1C structure in the existing art. The light-emitting device in the pixel driver circuit may be an organic light-emitting element, such as an organic light-emitting diode (OLED).

In an exemplary implementation, each of the seven transistors in the pixel driver circuit may be a P-type transistor or an N-type transistor. By using the same type of transistors in the pixel driver circuit, the process flow can be simplified, the process difficulty of the display panel can be reduced, and the yield of products can be improved. In some possible implementations, a first transistor T1 to a seventh transistor T7 may be all P-type transistors or all N-type transistors. It should be noted that the transistors used in the embodiments of the present disclosure may be thin film transistors or field effect transistors or other switch devices with same characteristics, and the thin film transistors may include oxide semiconductor thin film transistors, amorphous silicon thin film transistors, or polysilicon thin film transistors, etc. Since a source and a drain of a transistor may be symmetrical in structure, the source and the drain may have no difference in physical structure. In the embodiments of the present disclosure, for distinguishing purposes in the transistor, except a gate serving as a control electrode, one of the rest two electrodes is directly described as a first electrode, and the other of the rest two electrodes is directly described as a second electrode, and therefore, the first electrode and the second electrode of all or part of the transistors in the embodiments of the present disclosure may be exchangeable as needed.

In an exemplary implementation, besides the 7T1C (i.e., seven transistors and one capacitor) structure, the pixel driver circuit of the pixel may have a structure including other numbers of transistors, such as a 7T2C structure, a 6T1C structure, a 6T2C structure, or a 9T2C structure, which is not limited in the embodiments of the present disclosure.

A plurality of gate lines may extend to the peripheral region on a side of the display region, and be connected to a gate driver circuit which may provide scanning signals for the pixels in the display region through the gate lines, so that the pixels in the display region can be scanned line by line. A plurality of data lines may extend to the peripheral region on a side of the display region, and be connected to a source driver circuit which may provide data signals for the pixels in the display region through the data lines, and in cooperation with the scanning signals, light up light-emitting devices in the pixels line by line, thereby implementing a display function.

The bent part 101*b* of the display panel 101 may be disposed in the peripheral region, and may face a side of the body part 101*a* of the display panel 101 away from the display surface. The bent part 101 also has a certain display function, and can make an edge of the display panel 101 display to hide the bezel of the display panel 101, thereby reducing the bezel of the display panel 101 and improving the display effect.

The display module further has a bonding region disposed on a side of the peripheral region away from the display region, and the bonding region is provided with a plurality of contact pads each configured to be electrically connected to signal lines extending from the display region or the peripheral region. The contact pads may be exposed on a surface of the bonding region, i.e., not covered by any film layer, so that an edge is electrically connected to the flexible printed circuit 103. The flexible printed circuit 103 is electrically connected to an external control mainboard, and is configured to transmit signals or power from the external control mainboard. For example, the contact pads are electrically connected to a common signal line, a touch signal line, a driving signal line, a data connection line (electrically connected to data lines in the display region), and so on. The contact pads are electrically connected to various signal lines to enable mutual communication between the signal lines and the flexible printed circuit 103. The number and arrangement of contact pads are not particularly limited here, and may be set according to actual needs.

In some embodiments, as shown in FIG. 3, the land grid array package structure 104 is located on a side of the bent part 101*b* away from the body part 101*a*.

The land grid array package structure 104 may be specifically located on a side of the bent part 101*b* away from the body part 101*a*. Since the bent part 101*b* has a portion parallel to the body part 101*a*, the bent part 101*b* away from the body part 101*a* can provide a relatively flat bearing plane for the land grid array package structure 104, thereby preventing poor connection between the land grid array package structure 104 and the bent part 101 from affecting the display effect.

In some embodiments, as shown in FIG. 3, the display module further includes a flexible printed circuit 103 bound and connected to a side of the bent part 101*b* away from the body part 101*a*; and the flexible printed circuit 103 is bent toward a side of the flexible printed circuit close to the body part 101*a* to a side of the bent part 101*b* close to the body part 101*a*.

The flexible printed circuit 103 may be bonded and connected to a side of the bent part 101*b* away from the body part 101*a*, and may be bent again so that the flexible printed circuit 103 is bent to a side of the bent part 101*b* close to the body part 101*a*. As can be seen, most of the flexible printed circuit 103 is accommodated in a space between the body part 101*a* and the bent part 101*b*, which may save the space occupied by the flexible printed circuit 103, reserve more space for batteries, thereby increasing the battery capacity and further prolonging the standby time of the display apparatus.

Figure 4:
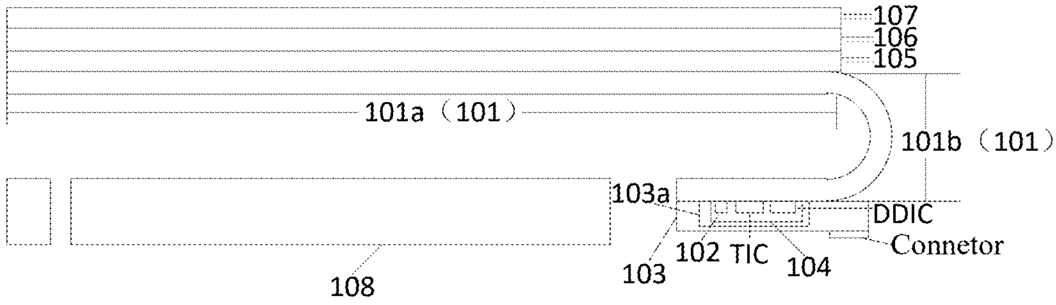
FIG. 4 is a schematic structural diagram of another display module according to an embodiment of the present disclosure.

FIG. 4 is a schematic structural diagram of another display module according to an embodiment of the present disclosure. As shown in FIG. 4, the display module further includes a flexible printed circuit 103 bound and connected to a side of the bent part 101*b* away from the body part 101*a*; and the flexible printed circuit 103 is bent toward a side of the flexible printed circuit away from the body part 101*a* to a side of the bent part 101*b* away from the body part 101*a*.

The display module shown in FIG. 4 differs from that of FIG. 3 in that: the flexible printed circuit 103 in the display module of FIG. 4 is reversely bound to the bent part 101*b*, and the flexible printed circuit 103 extends along the bent part 101*b*, so that the flexible printed circuit 103 can cover the bent part 101*b* but not the edge of the bent part 101*b*.

Therefore, the space reserved for batteries can extend to the edge of the bent part 101*b*, which may further save the space occupied by the flexible printed circuit 103, and increase the space reserved for batteries, thereby increasing the battery capacity and further prolonging the standby time of the display apparatus.

Figure 5:
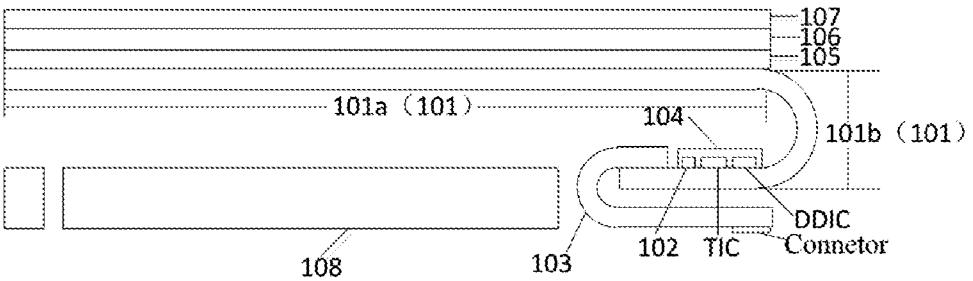
FIG. 5 is a schematic structural diagram of yet another display module according to an embodiment of the present disclosure.

FIG. 5 is a schematic structural diagram of yet another display module according to an embodiment of the present disclosure. As shown in FIG. 5, the land grid array package structure 104 is located on a side of the bent part 101*b* close to the body part 101*a*.

The land grid array package structure 104 may be specifically located on a side of the bent part 101*b* close to the body part 101*a*. Since the bent part 101*b* has a portion parallel to the body part 101*a*, the bent part 101*b* away from the body part 101*a* can provide a relatively flat bearing plane for the land grid array package structure 104, thereby preventing poor connection between the land grid array package structure 104 and the bent part 101 from affecting the display effect.

In some embodiments, as shown in FIG. 5, the display module further includes a flexible printed circuit 103 bound and connected to one side of the bent part 101*b* close to the body part 101*a*; and the flexible printed circuit 103 is bent toward a side of the flexible printed circuit away from the body part 101*a* to a side of the bent part 101*b* away from the body part 101*a*.

The flexible printed circuit 103 may be bonded and connected to a side of the bent part 101*b* close to the body part 101*a*, and may be bent again so that the flexible printed circuit 103 is bent to a side of the bent part 101*b* away from the body part 101*a*. As can be seen, most of the flexible printed circuit 103 is accommodated in a space between the body part 101*a* and the bent part 101*b*, which may save the space occupied by the flexible printed circuit 103 and reserve more space for batteries, thereby increasing the battery capacity and further prolonging the standby time of the display apparatus.

Figure 6:
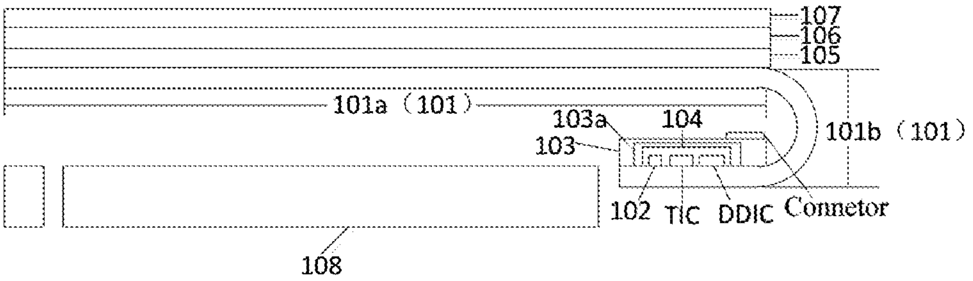
FIG. 6 is a schematic structural diagram of still another display module according to an embodiment of the present disclosure.

FIG. 6 is a schematic structural diagram of still another display module according to an embodiment of the present disclosure. As shown in FIG. 6, the display module further includes a flexible printed circuit 103 bound and connected to a side of the bent part 101*b* close to the body part 101*a*; and the flexible printed circuit 103 extends along the bent part 101*b* and covers the bent part 101*b*.

The display module shown in FIG. 6 differs from that of FIG. 5 in that: the flexible printed circuit 103 in the display module of FIG. 6 is reversely bound to the bent part 101*b*, and the flexible printed circuit 103 extends along the bent part 101*b*, so that the flexible printed circuit 103 can cover the bent part 101*b* but not the edge of the bent part 101*b*. Therefore, the space reserved for batteries can extend to the edge of the bent part 101*b*, which may further save the space occupied by the flexible printed circuit 103, and increase the space reserved for batteries, thereby increasing the battery capacity and further prolonging the standby time of the display apparatus.

In some embodiments, as shown in FIGS. 3 and 5, the land grid array package structure 104 is located in a region other than a bonding region of the flexible printed circuit 103 and the bent part 101*b*.

In the display module shown in FIGS. 3 and 5, after being bonded and connected to the bent part 101*b* of the display panel 101, the flexible printed circuit 103 extends in a direction away from the land grid array package structure 104, the flexible printed circuit 103 does not cover regions other than the bonding region of the bent part 101*b* of the display panel 101, and the land grid array package structure 104 may be disposed in a region other than the bonding region. The flexible printed circuit 103 and the land grid array package structure 104 are not overlapped with each other, and wires connecting the flexible printed circuit 103 and the land grid array package structure 104 are rarely overlapped, so that the structure of the display module is simplified, the complexity of wires in the display module is reduced, and the preparation cost is saved.

In some embodiments, as shown in FIGS. 4 and 6, the flexible printed circuit 103 has a hollowed-out portion 103*a* into which the land grid array package structure 104 is embedded.

In the display module shown in FIGS. 4 and 6, after being bonded and connected to the bent part 101*b* of the display panel 101, the flexible printed circuit 103 extends in a direction toward the land grid array package structure 104, so that the flexible printed circuit 103 covers the bent part 101*b* of the display panel 101 as well as the land grid array package structure 104 on the bent part 101*b*. A hollowed-out portion 103*a* may be formed in the flexible printed circuit 103, into which the land grid array package structure 104 can be embedded, so that the flexible printed circuit 103 is prevented from tilting at a position corresponding to the land grid array package structure 104. Therefore, surface flatness of the flexible printed circuit 103 is guaranteed to facilitate bonding with other film layers, while a thickness of the display module is reduced to facilitate lightweight of the display module.

In some embodiments, as shown in FIGS. 3 to 6, the display module further includes a connector; and the connector is electrically connected to the flexible printed circuit 103. The connector may be directly disposed on an external circuit structure connected to the flexible printed circuit 103, for example, a control mainboard or the like, which may be connected to the flexible printed circuit 103 through the connector and input a control signal.

Figure 7:
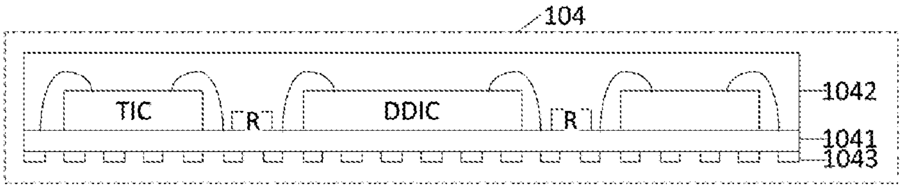
FIG. 7 is a schematic diagram of a land grid array package structure in a display module according to an embodiment of the present disclosure.

In some embodiments, FIG. 7 is a schematic diagram of a land grid array package structure in a display module according to an embodiment of the present disclosure. As shown in FIG. 7, the land grid array package structure 104 includes a package substrate 1041, a driver integrated circuit and a passive device 102 on the package substrate 1041, and a package layer 1042 covering the driver integrated circuit and the passive device 102. The driver integrated circuit and the passive device 102 may be completely packaged in a package space formed by the package substrate 1041 and the package layer 1042. In this manner, the land grid array package structure 104 may be integrated onto the display panel 101 as a separate structure.

In some embodiments, as shown in FIG. 7, the driver integrated circuit includes a touch integrated circuit (T1C) and a display driver integrated circuit (DDIC); and the passive device 102 includes a capacitor (not shown), a resistor R, an oscillator (not shown), and a memory (not shown).

A plurality of metal bumps 1043 are provided on a back side of the package substrate 101, the T1C and the DDIC may be electrically connected to the metal bumps 1043 through gold wires, and the resistor R may be directly connected to the metal bumps 1043 in a contact manner. In the process of integrating with the display panel 101, the metal bumps 1043 may be directly electrically connected to connection pads in the display panel 101 without wiring.

Figure 8:
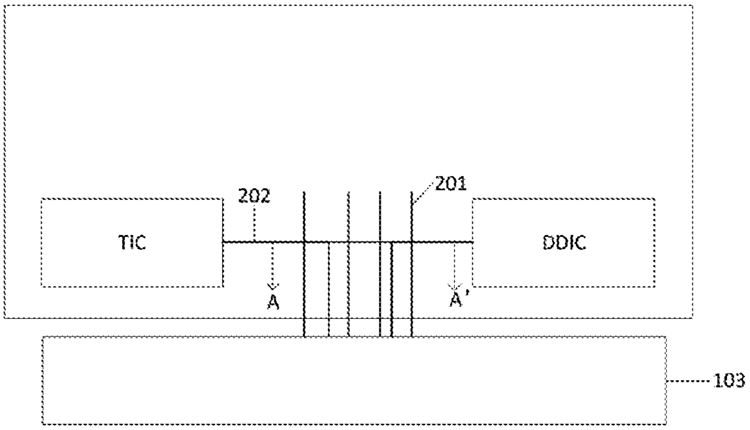
FIG. 8 is a schematic plan view illustrating a partial structure of a display module according to an embodiment of the present disclosure.
Figure 9:
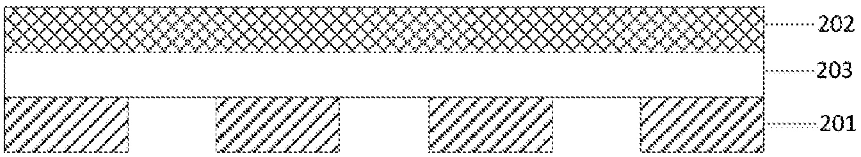
FIG. 9 is a schematic sectional structural view of the display module of FIG. 8 along a direction A-A'.

In some embodiments, as shown in FIGS. 8 and 9, the display panel 101 is connected to the flexible printed circuit 103 through a first metal wire 201, and the driver integrated circuit is connected to the flexible printed circuit 103 through a second metal wire 202; and extending directions of the first metal wire 201 and the second metal wire 202 are intersected, and an anti-interference layer 203 is disposed between the first metal wire and the second metal wire.

In practical applications, although the DDIC and the T1C are packaged in the land grid array package structure 104, the first metal wire 201 is still desired to be electrically connected to the flexible printed circuit 103, and meanwhile, the display panel 101 is electrically connected to the flexible printed circuit 103 through the second metal wire 202, and extending directions of the first metal wire 201 and the second metal wire 202 are intersected. By disposing the anti-interference layer 203 between the first metal wire 201 and the second metal wire 202, crosstalk between signals transmitted in the first metal wire 201 and in the second metal wire 202 that may affect the display effect can be avoided. The anti-interference layer may be formed of an organic material through an inkjet printing process, and have a thickness greater than or equal to 8 μm, to ensure a relatively long distance between the first metal wire 201 and the second metal wire 202 and an effect of preventing crosstalk. Meanwhile, the anti-interference layer 203 should not be too thick, for example, may have a thickness less than or equal to 15 μm, to avoid increasing the overall thickness of the display module and affecting lightweight of the display module.

In some embodiments, the display module further includes a polarization layer 105, a touch panel 106 and a cover plate 107. The polarization layer 105 is located on a display surface side of the body part 101*a*. The touch panel 106 is located on a side of the polarization layer 105 away from the body part 101*a*. The cover plate 107 is located on a side of the touch panel 106 away from the body part 101*a*. Specifically, the display panel 101 may be an organic light-emitting diode (OLED) display panel, and the polarization layer 105 may be located on a display surface side of the display panel 101*a*, and convert ambient light into linearly polarized light, which enters the body part 101*a* of the display panel 101 and then is reflected by films such as an anode before impinging on the polarization layer 105. Due to the reflection, the linearly polarized light is changed in polarization direction and cannot be emitted from the polarization layer 105, thereby achieving an effect of preventing reflection of the ambient light and improving the display effect of the display panel 101. The touch panel 106 is provided with a touch unit that may locate a finger touch position of a user to implement a touch function. The cover plate 107 may be made of a rigid material such as glass, to protect the touch panel 106, the display panel 101, and the like covered by the cover plate from being damaged by an external force. Apparently, the cover plate 107 may be made of a flexible transparent material such as polyimide to achieve the functions of folding.

In some embodiments, the display panel 101 further includes a barrier in the peripheral region and surrounding a periphery of the display region. In at least one example, the barrier has a dam structure that can block external moisture or oxygen from entering the display region, thereby avoiding an influence on the display effect. For example, one or more barriers may be provided. Further, when a plurality of barriers are provided, the blocking ability can be enhanced. For example, the barrier includes a first barrier and a second barrier, and the second barrier is located on a side of the first barrier away from the display region, so as to further prevent external moisture or oxygen from entering the display region, and provide double protection for the display region. In at least one example, the first barrier has a height less than the second barrier. In this manner, a path for external moisture and oxygen entering the display region becomes longer, the difficulty of entering the display region is increased, and the blocking capability of the barrier is further enhanced.

The touch panel 106 includes a touching electrode (TE) and touch signal lines. The touching electrode is located in the display region and configured to detect a touch in the display region. For example, the touching electrode includes a first touching electrode and a second touching electrode. A plurality of first touching electrodes form first touching electrode lines extending in an x direction, and a plurality of second touching electrodes form second touching electrode lines extending in a y direction. The plurality of first touching electrode lines and the plurality of second touching electrode lines are intersected with each other, so that touching capacitors are formed at intersections of the first touching electrode lines and the second touching electrode lines. A touch position is detected by detecting a change in a touching capacitor due to, for example, a finger approaching the touching capacitor while touching. Each touch signal line is configured to be electrically connected to a touching electrode in the display region. For example, the touch signal line includes a first touch signal line and a second touch signal line. Each first touch signal line is electrically connected to a first touching electrode line extending in the x direction, and each second touch signal line is electrically connected to a second touching electrode line extending in the y direction. In a specific implementation, each first touching electrode line is electrically connected to one first touch signal line, and each second touching electrode line is electrically connected to one second touch signal line, so that the touch signal generated by each touching electrode can be transmitted to the peripheral region through the corresponding touch signal line, which is electrically connected to an external touch chip through the contact pads in the peripheral region.

In a second aspect, an embodiment of the present disclosure further provides a display apparatus, including the display module according to any of the above embodiments, and a power supply source 108 on a side of the body part 101*a* away from a display surface of the body part 101*a*. Specifically, the power supply source 108 may be a battery. The battery may supply power for other structures in the display module, such as the display panel 101, so that the display module can implement the display and touch functions. The driver integrated circuit, the passive device 102 and other structures in the display module are all packaged in the land grid array package structure 104, and the land grid array package structure 104 is directly integrated onto the display panel 101, so that the driver integrated circuit, the passive device 102 and other structures are not necessarily fixed onto the flexible printed circuit. In this manner, the space occupied by the flexible printed circuit 103 can be saved, and more space can be reserved for batteries, so that the battery capacity can be increased, and the standby time of the display apparatus can be further prolonged. Specifically, the display apparatus may be a mobile phone, a tablet, a television, a computer monitor, a laptop, a digital album, a navigator or any other product or component having a display function, the implementation principle and beneficial effects of which are the same as those of the display module described above and thus are not repeated here.

It will be appreciated that the above implementations are merely exemplary implementations for the purpose of illustrating the principle of the present disclosure, and the present disclosure is not limited thereto. It will be apparent to one of ordinary skill in the art that various modifications and variations may be made without departing from the spirit or essence of the present disclosure. Such modifications and variations should also be considered as falling into the protection scope of the present disclosure.

What is claimed is:

1. A display module, comprising a display panel, and a driver integrated circuit and a passive device each electrically connected to the display panel; wherein the driver integrated circuit and the passive device are packaged in a land grid array package structure; and the land grid array package structure is integrated onto the display panel, wherein the display panel comprises a body part and a bent part connected to a side of the body part; and the bent part is bent in a direction away from a display surface of the body part, and extends in a direction parallel to the body part, wherein the land grid array package structure is located on a side of the bent part away from the body part, wherein the display module further comprises a flexible printed circuit bonded and connected to the side of the bent part away from the body part; and the flexible printed circuit extends in an extending direction of the bent part and covers the bent part, wherein the flexible printed circuit has a hollowed-out portion into which the land grid array package structure is embedded.

2. The display module according to claim 1, wherein the display module further comprises a connector; and the connector is electrically connected to the flexible printed circuit.

3. The display module according to claim 1, wherein the driver integrated circuit comprises a touch integrated circuit and a display driver integrated circuit; and the passive device comprises a capacitor, a resistor, an oscillator, and a memory.

4. The display module according to claim 1, wherein the display panel is connected to the flexible printed circuit through a first metal wire, and the driver integrated circuit is connected to the flexible printed circuit through a second metal wire; and extending directions of the first metal wire and the second metal wire are intersected, and an anti-interference layer is disposed between the first metal wire and the second metal wire.

5. The display module according to claim 1, wherein the display module further comprises a polarization layer, a touch panel and a cover plate;

the polarization layer is located on a display surface side of the body part;

the touch panel is located on a side of the polarization layer away from the body part; and the cover plate is located on a side of the touch panel away from the body part.

6. A display apparatus, wherein the display apparatus comprises the display module according to claim 1 and a power supply source on a side of the body part away from a display surface of the body part.

7. A display module, comprising a display panel, and a driver integrated circuit and a passive device each electrically connected to the display panel; wherein the driver integrated circuit and the passive device are packaged in a land grid array package structure; and the land grid array package structure is integrated onto the display panel, wherein the display panel comprises a body part and a bent part connected to a side of the body part; and the bent part is bent in a direction away from a display surface of the body part, and extends in a direction parallel to the body part, wherein the land grid array package structure is located on a side of the bent part close to the body part, wherein the display module further comprises a flexible printed circuit bonded and connected to the side of the bent part close to the body part; and the flexible printed circuit extends in an extending direction of the bent part and covers the bent part, wherein the flexible printed circuit has a hollowed-out portion into which the land grid array package structure is embedded.

* * * * *